(12) United States Patent
Watanabe

(10) Patent No.: US 7,384,859 B2
(45) Date of Patent: Jun. 10, 2008

(54) CUTTING METHOD FOR SUBSTRATE AND CUTTING APPARATUS THEREFOR

(75) Inventor: Shinya Watanabe, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/634,768

(22) Filed: Dec. 6, 2006

(65) Prior Publication Data
US 2007/0134890 A1    Jun. 14, 2007

(30) Foreign Application Priority Data
Dec. 8, 2005    (JP)    ............... 2005-355078

(51) Int. Cl.
*H01L 21/00*    (2006.01)
(52) U.S. Cl. ............... 438/462; 257/E21.599
(58) Field of Classification Search .................. 438/33, 438/113, 460, 462; 451/21; 125/13.01, 125/23.01; 83/955; 257/620, 622, E21.596, 257/E21.599; 29/25.01
See application file for complete search history.

(56) References Cited

U.S. PATENT DOCUMENTS 6,581,586 B2 *    6/2003    Sekiya .................... 125/13.01

FOREIGN PATENT DOCUMENTS

JP    11-054461    2/1999
JP    2000-173961 A    6/2000

\* cited by examiner

*Primary Examiner*—David A Zarneke
(74) *Attorney, Agent, or Firm*—Brinks Hofer Gilson & Lione

(57)    ABSTRACT

A cutting method for substrates includes: preparing a substrate which has a predetermined circular cut line set thereon; chucking the substrate on a surface of a chuck table which is rotatably supported around a rotation axis of the chuck table such that the predetermined circular cut line of the substrate is concentric with the chuck table; disposing a disc-shaped cutting blade having a rotation axis so that the cutting blade faces the substrate; and cutting the substrate along the predetermined circular cut line of the substrate by the cutting blade while rotating the substrate by rotating the chuck table. The substrate has two cut points which are set on one side and the other side of the predetermined circular cut line such that a rotation center of the substrate is positioned between the one side and the other side of the predetermined circular cut line. The cutting blade is disposed so that the rotation axis of the cutting blade perpendicularly crosses the rotation axis of the chuck table. The cutting blade is reciprocatably supported along the rotation axis of the cutting blade, and alternately cuts into the two cut points of the substrate.

2 Claims, 8 Drawing Sheets

US 7,384,859 B2

CUTTING METHOD FOR SUBSTRATE AND CUTTING APPARATUS THEREFOR

This application claims priority under 35 U.S.C. § 119 to Japanese Patent Application No. JP2005-355078 filed Dec. 8, 2005, the entire content of which is hereby incorporated by reference.

BACKGROUND OF THE INVENTION

1. Field of the Invention

The present invention relates to a cutting method for substrates (for example, semiconductor wafers) in which a substrate is circularly cut by using a cutting blade and a groove is formed on a substrate by using it. The present invention relates to a cutting apparatus which is advantageously used for the cutting method.

2. Description of Related Art

Semiconductor devices (for example, semiconductor chips) are produced by the following processes. That is, a wafer (for example, a semiconductor wafer) which is composed of a semiconductor substrate material is prepared. Grid-like predetermined division lines are formed on a surface of the wafer, so that plural rectangular device regions are defined by the predetermined division lines on the surface of the wafer. Next, electronic circuits (for example, Integrated Circuits (=ICs) and Large Scale Integrations (=LSIs)) are formed on the device regions. Next, a rear surface of the wafer is ground, so that the wafer is thinned to have a desired thickness. Next, the wafer is divided along the predetermined division lines. As a result, the semiconductor devices (for example, semiconductor chips) are produced. In the above processes, in order to prevent the occurrence of damage (for example, cracking and breakage) in the wafer during handling of the wafer, a circumferential edge of the wafer may be chamfered before the thinning of the wafer.

When a wafer having a chamfered circumferential edge is thinned, the circumferential edge in a cross section is outwardly sharper and thinner so as to have a knife edge shape. Since the same damage may easily occur again in the above condition of the circumferential edge, the circumferential edge is subjected to cutting before thinning of the wafer so as not to have a knife edge shape, so that the circumferential edge has a surface which extends along a thickness direction of the wafer (which extends perpendicularly to a surface of the wafer) as disclosed in Japanese Unexamined Patent Application Publication No. 2000-173961. If damage (for example, cracking and breakage) occurs at the circumferential edge, the circumferential edge may be the origin of damage which extends to device regions having electronic circuits formed thereon, and the wafer itself may break and become unusable. Therefore, the above cutting of the circumferential edge is advantageous.

The cutting for preventing the generation of a knife edge shape is performed by forming either a ring-shaped step or a circular groove at a circumferential edge proximate to a surface of a chamfered wafer before thinning. The step and the groove have circular shapes which have diameters corresponding to a diameter of the wafer finally obtained and which have depths corresponding to a desired thickness of the wafer after thinning. When a rear surface of the wafer is thinned by grinding, the circumferential edge does not have a knife edge shape and has a surface extending along a thickness direction as disclosed in Japanese Unexamined Patent Application Publication No. 2000-173961 (in particular, FIGS. 2 to 4).

The above cutting of the circumferential edge uses the following method. That is, a wafer is held horizontally so that a surface thereof faces upward. A cutting blade, which is rotated at a high speed and is positioned above the wafer, is moved downward and cuts a layer of the wafer, which has a predetermined depth from the surface thereof, at a cutting start point on the wafer. From this condition, the wafer is rotated relatively to the cutting blade, thereby cutting the wafer in a horizontal direction.

In addition, in the field of semiconductor devices, there are cases in which either a wafer having a small diameter or a wafer having a shape different from a circular shape is obtained from a wafer having a relatively large diameter by cutting. In these cases, a cutting blade is moved downward and then cuts a layer, which has a predetermined depth from a surface of the wafer, in a horizontal direction as disclosed in Japanese Unexamined Patent Application Publication No. H11-54461.

In the cutting apparatuses disclosed in Japanese Unexamined Patent Application Publications described above, the wafer which is cut by the cutting blade is horizontally held on a disc-shaped rotation pedestal (for example, chuck table) by a device (for example, vacuum chucking device). The rotation pedestal has a rotation axis extending in a vertical direction. On the other hand, the cutting blade is coaxially provided at an end of a spindle having a rotation shaft. The spindle is supported such that an axial direction thereof horizontally extends in a radius direction of the chuck table. The cutting blade moves downwardly to the wafer and cuts it. While the cutting position of the cutting blade is secured, a groove or the like is circularly formed by rotating the wafer 1.

In the above cutting feature, since the circular cutting is performed while the cutting position of the cutting blade with respect to the wafer is unchangeable, two surfaces of the cutting blade are different from each other in wear amount. FIGS. 12A and 12B are schematic diagrams showing the above condition of the cutting blade. When a relative moving direction of a cutting blade 90 in an arrow direction curves at a predetermined rate, front and back edge portions (which correspond to a hatched portion in FIG. 12B) of the cutting blade 90 on an outer circumferential side of the moving direction strongly contact an internal wall surface of a groove 91 formed on the wafer 1. Due to this, an outer circumferential surface of the cutting blade 90 on the side of the moving direction wears more greatly than an internal circumferential surface thereof. When the wear amount of the one surface is larger than the other surface in the above manner, the wear occurs faster in this circular cutting method than in a typical linear cutting method, so that the lifetime of the cutting blade becomes short. As a result, the exchange frequency of the cutting blade is high, so that production is troublesome and production cost is high.

SUMMARY OF THE INVENTION

An object of the present invention is to provide a cutting method in which partial wear of cutting blade is inhibited by balancing wear amounts of both surfaces of the cutting blade so that a lifetime of the cutting blade becomes long and production can be simplified and production cost can be reduced when the cutting blade circularly cuts the substrate. An object of the present invention is to provide a cutting apparatus used in the cutting method.

According to one aspect of the present invention, a cutting method for substrates includes: preparing a substrate which has a predetermined circular cut line set thereon; chucking the substrate on a surface of a chuck table which is rotatably supported around a rotation axis of the chuck table such that the predetermined circular cut line of the substrate is concentric with the chuck table; disposing a disc-shaped cutting blade having a rotation axis so that the cutting blade faces the substrate; and cutting the substrate along the predetermined circular cut line of the substrate by the cutting blade while rotating the substrate by rotating the chuck table. In this cutting method, the substrate has two cut points which are set on one side and the other side of the predetermined circular cut line such that a rotation center of the substrate is positioned between the one side and the other side of the predetermined circular cut line. The cutting blade is disposed so that the rotation axis of the cutting blade perpendicularly crosses the rotation axis of the chuck table. The cutting blade is reciprocatably supported along the rotation axis of the cutting blade, and the cutting blade alternately cuts into the two cut points of the substrate.

In conventional techniques, one cut point by a cutting blade was provided on a substrate. In contrast, in the cutting method of the present invention, the two cut points by the cutting blade are provided on both sides of the rotation center of the substrate, that is, the one side and the other side of the rotation center of the substrate. The cutting blade alternately cut into the cut points of the substrate with the same frequency. The two cut points may be symmetrical with respect to the rotation center of the substrate. When the cutting blade cuts into the cut point of the substrate, as described above, the outer circumferential surface of the cutting blade on the side of the relative moving direction wears more greatly than the internal circumferential surface thereof, so that partial wear occurs on the cutting blade. In the cutting method of the present invention, for example, when the cutting blade is set at the cut point on the one side of the substrate, one surface of the cutting blade is disposed at an outer circumferential surface on the one side of the substrate. Next, when the cutting blade is set at the cut point on the other side of the substrate, the one surface of the cutting blade is disposed at an internal circumferential surface on the other side of the substrate. Therefore, the other surface of the cutting blade which is disposed at the internal circumferential surface on the one side of the substrate wears a little when the cutting blade is set at the cut point on the one side of the substrate. Next, the other surface of the cutting blade which is disposed at the outer circumferential surface on the other side of the substrate wears much when the cutting blade is disposed at the cut point on the other side of the substrate. In the above manner, the cut points on the one side and on the other side of the substrate are alternately used, so that partial wear alternately occurs on each surface of the cutting blade. The above alternate using of the cut points on the one side and the other side is sequently repeated, so that wear amounts of the surfaces of the cutting blade are balanced. As a result, partial wear of the entire surfaces of the cutting blade can be inhibited.

When the cutting blade cuts the substrate which is rotated, down cutting or up cutting may be performed. In the down cutting, the rotation direction of the cutting blade corresponds with the rotation direction of the substrate between facing surfaces of the cutting blade and the substrate which face each other. In the up cutting, the rotation direction of the cutting blade is opposite to the rotation direction of the substrate between facing surfaces of the cutting blade and the substrate which face each other. When the substrate is chucked and held on the chuck table in the cutting method of the present invention, the down cutting is desirably used since the substrate is pressed on the chuck table by the cutting blade and the held condition of the substrate by the chuck table is secured. On the other hand, in the up cutting, the cutting blade draw up the substrate and the substrate is thereby vibrated, so that both sides of a cut line (for example, groove or penetration slit) which is cut by the cutting blade may have cracking. Therefore, the up cutting is not desirable.

In a case in which the cutting blade cuts into both sides of the rotation center of the substrate in the cutting method of the present invention, when the rotation direction of the chuck table is unchangeable, the down cutting may be performed on the one side of the substrate and the up cutting may be performed on the other side of the substrate. Therefore, the rotation direction of the cutting blade is desirably changed between in a case in which the cutting blade cuts into cut point of the one side and in a case in which the cutting blade cuts into the cut point of the other side.

According to another aspect of the present invention, a cutting apparatus for performing the above cutting method is provided. The cutting apparatus for substrates includes: a chuck table which is rotatably supported around a rotation axis of the chucking table and holds a substrate having a predetermined circular cut line which are set on the substrate so as to concentric with the chuck table; and a disc-shaped cutting blade which has a rotation axis, faces the substrate held by the chuck table, and cuts the predetermined circular cut line. In this cutting apparatus, the cutting blade is disposed so that the rotation axis of the cutting blade perpendicularly crosses the rotation axis of the chuck table. The cutting blade is reciprocatably supported along the rotation axis of the cutting blade, and the cutting blade has a reciprocating range which corresponds to at least a diameter of the predetermined circular cut line.

In the cutting apparatus of the present invention, the cutting blade is moved along the rotation axis of the cutting blade, so that the cutting blade can be disposed at positions of the predetermined circular cut line on both sides of the rotation center of the substrate. The cutting blade moves from the above positions to the substrate and cuts into the substrate. Then, the chuck table is rotated, so that the predetermined circular cut line is cut. Cut points by the cutting blade on the one side and the other side of the substrate may be symmetrical with respect to the rotation center of the substrate. The cutting blade alternately cuts into the cut points, so that partial wear of the cutting blade can be inhibited as described above.

According to the present invention, when the cutting blade cuts the substrate on the predetermined circular cut line and the cutting by the cutting blade is circularly performed, the cutting blade alternately cuts into the two cut points which are set to be symmetrical with respect to the rotation center of the substrate at an appropriate ratio. Therefore, partial wear of cutting blade is inhibited by balancing wear amounts of both surfaces of the cutting blade when the cutting blade circularly cuts the substrate. As a result, a lifetime of the cutting blade becomes long and production can be simplified and production cost can be reduced.

BRIEF DESCRIPTION OF THE DRAWINGS

FIG. 4A is a perspective view of the above condition, FIG. 4B is a side view thereof, and FIG. 4C is a front cross sectional view of a main portion thereof.

FIG. 5A is a perspective view of the above condition, FIG. 5B is a side view thereof, and FIG. 5C is a front cross sectional view of a main portion thereof.

FIG. 7A shows a down cutting and FIG. 7B shows an up cutting.

DETAILED DESCRIPTION OF THE INVENTION

An embodiment of the present invention will be explained hereinafter with reference to the drawings.

1. Semiconductor Wafer

Figure 1A:
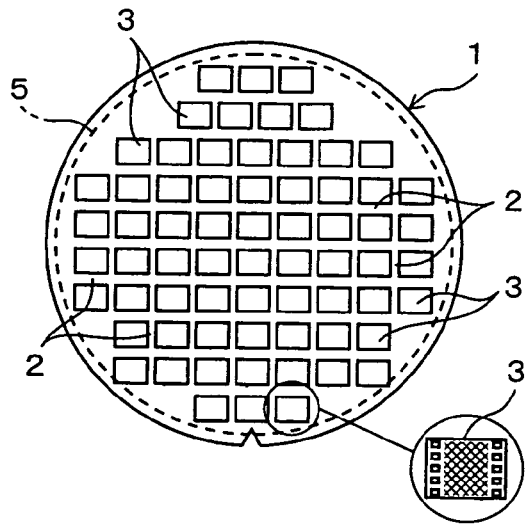
FIGS. 1A and 1B are an overall plan view and a side view which show a semiconductor wafer in an embodiment according to the present invention, and an enlarged portion in FIG. 1A shows a semiconductor chip.
Figure 1B:

FIGS. 1A and 1B show a disc-shaped semiconductor wafer 1 (hereinafter referred to simply as "wafer 1") which is a substrate in the embodiment. The wafer 1 is a silicon wafer or the like and has a thickness of about 600 to 700 μm. Grid-like predetermined division lines 2 are formed on a surface of the wafer 1 so that plural rectangular semiconductor chips 3 are defined by the predetermined division lines 2 on the surface of the wafer 1. Electronic circuits (for example, Integrated Circuits (=ICs) and Large Scale Integrations (=LSIs)) are formed on surfaces of the semiconductor chips 3.

Figure 2:
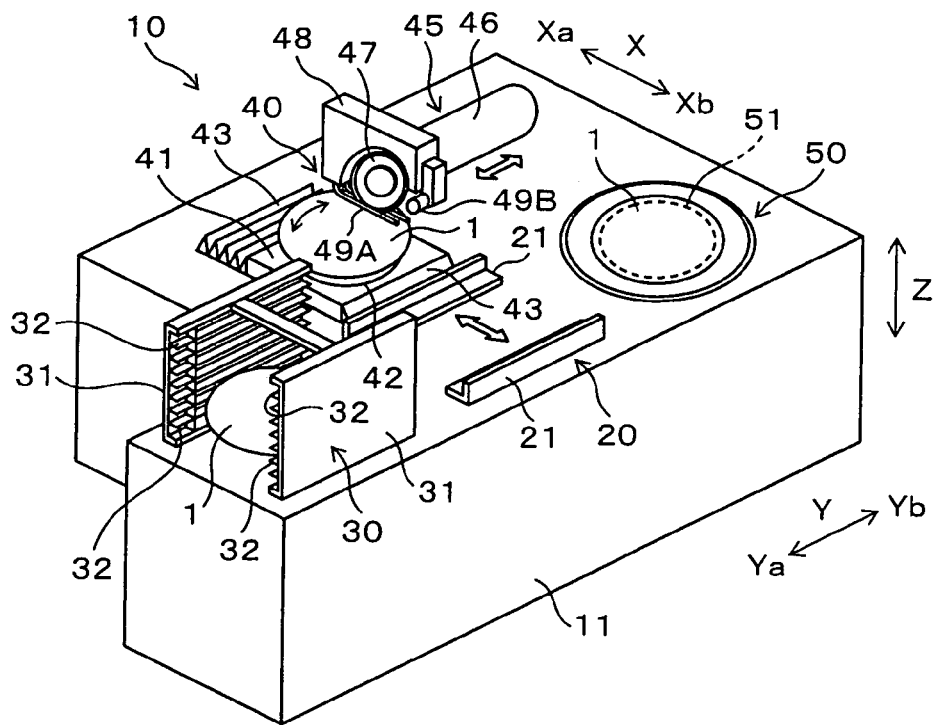
FIG. 2 is a perspective view of a cutting apparatus of the embodiment according to the present invention.

A rear surface of the wafer 1 is ground so that the wafer 1 is thinned to have a desired thickness (for example, about 50 to 100 μm). Next, the wafer 1 is cut along the predetermined division lines 2 and is divided into the semiconductor chips 3. In the embodiment, a cutting method for preventing formation of a knife edge at the circumferential edge of the wafer 1 after the thinning is performed by forming a groove along the predetermined cut line 5 on the wafer 1 by using a cutting apparatus 10 as shown in FIG. 2. The predetermined cut line 5 is shown by using a dotted line in FIG. 1A and corresponds to an external form line of the wafer 1 which is intended to be obtained. The cutting apparatus 10 will be described hereinafter.

2. Cutting Apparatus

The cutting apparatus 10 is equipped with an approximately rectangular parallelepiped pedestal 11. A positioning mechanism 20 is provided on a flat upper surface of the pedestal 11. A cassette 30, a cutting mechanism 40, and a cleaning unit 50 are disposed around the positioning mechanism 20 in a clockwise direction. Plural wafers 1 are disposed at a predetermined position on the pedestal 11 while being provided in the cassette 30. As shown in FIG. 2, an X direction denotes one side direction of the pedestal 11 and a Y direction denotes another side direction of the pedestal 11. In addition, "a" or "b" is added to one direction or another direction of the X and Y directions. In particular, when directions are specified, reference symbols (Xa, Xb, Ya, Yb) are appropriately used.

One wafer 1 is ejected from the cassette 30. The wafer 1 is moved to the cutting mechanism 40 via the positioning mechanism 20, and a circumferential edge of the wafer 1 is cut by the cutting mechanism 40. Next, the wafer 1 is moved to the cleaning unit 50 via the positioning mechanism 20, and is cleaned by the cleaning unit 50. The cleaned wafer 1 is moved again via the positioning mechanism 20, and is returned to the cassette 30. A moving robot (not shown in FIG. 2) is provided on the pedestal 11. The cassette 30, the positioning mechanism 20, the cutting mechanism 40, and the cleaning unit 50 will be explained hereinafter in accordance with the moving order of the wafer 1.

A. Cassette

The cassette 30 can be transported. Plural wafers 1 are laminated and provided in the cassette 30. The cassette 30 is removably provided in a predetermined cassette setting portion. The cassette 30 has a pair of cases 31 which are parallel to and apart from each other. Plural racks 32 are provided on internal surfaces of the cases 31, which face each other, in a vertical direction. The wafers 1 are slidably inserted in the racks 32 such that surfaces of the wafers 1 face upward and are in a horizontal position. The cassette 30 is set on the cassette setting portion on the pedestal 11 such that sliding directions of the wafers 1 are parallel to the Y direction. The wafers 1 in the cassette 30 are moved to the positioning mechanism 20 by the above moving robot.

B. Positioning Mechanism

The positioning mechanism 20 has a pair of guide bars 21 which extends in the Y direction and which are movable toward and counter to each other in cooperation in the X direction perpendicular to the Y direction. The wafers 1 are disposed between the guide bars 21 on the pedestal 11. The wafers 1 are held by the guide bars 21 which move toward each other, so that relay positions with respect to the cutting mechanism 40, the cleaning unit 50, and the cassette 30 are determined.

C. Cutting Mechanism

The cutting mechanism 40 is equipped with a rectangular table base 41, a disc-shaped chuck table 42 which is rotatably provided on the table base 41, and a cutting unit 45 which is disposed above the chuck table 42. The table base 41 is movable in the X direction via a guide rail (not shown in FIG. 2) on the pedestal 11, and is reciprocated by a reciprocating mechanism (not shown in FIG. 2). The chuck table 42 has a flat upper surface. The chuck table 42 is supported by the table base 41 to be rotatable around a Z direction (vertical direction), and is rotated by a rotation driving mechanism (not shown in FIG. 2) in a clockwise direction or in a counterclockwise direction.

The chuck table 42 is a typical vacuum chuck type. The chuck table 42 has many small chucking holes which communicate between a surface of the chuck table 42 and a rear surface thereof. An air drawing opening of a vacuum apparatus (not shown in FIG. 2) is disposed on the rear surface of the chuck table 42. The wafer 1 is disposed on the upper surface of the chuck table 42, and is chucked and held thereon by operating the vacuum apparatus. A cornice-shaped cover 43 is stretchably provided on both ends of the moving direction of the table base 41. The cornice-shaped cover 43 covers the moving path of the table base 41 so as to prevent intrusion of dust and waste thereinto.

Figure 3:
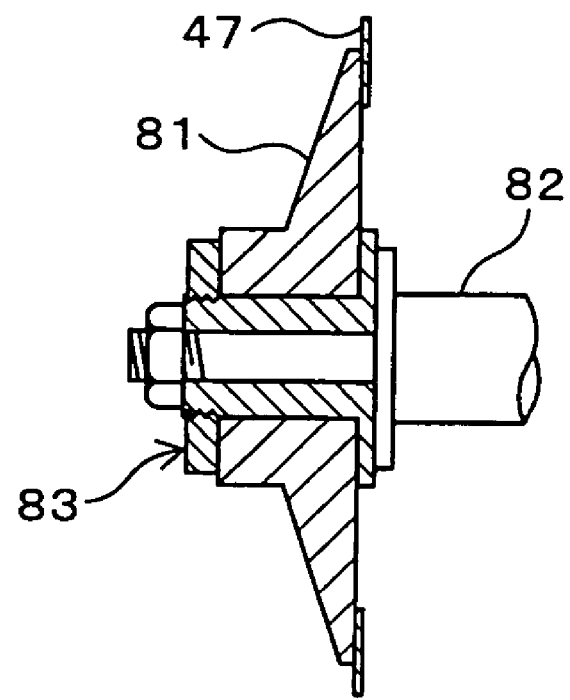
FIG. 3 is a cross sectional view showing a structure for mounting a cutting blade to a spindle.

The cutting unit 45 is equipped with a cylindrical spindle 46 and a cutting blade 47. The spindle 46 is provided such that an axial direction thereof is parallel to the Y direction. The cutting blade 47 is mounted to an end portion (which is on a side of the Ya direction in FIG. 2) of the spindle 46. As shown in FIG. 3, the cutting blade 47 is called a hub plate and is adhered to a circumferential edge of an umbrella-shaped hub 81. The hub 81 is fixed by a holding metal fitting 83 at a leading end of a rotation shaft 82. The rotation shaft 82 is rotated by a motor which is not shown in FIG. 3 and is provided in the spindle 46. The rotation direction of the cutting blade 47 is one direction. The rotation shaft 82 is coaxially provided in the spindle 46. The spindle 46 is supported by a frame so as to reciprocate in the Y direction and move upwardly and downwardly in the Z direction in the condition that the axial direction of the spindle 46 is parallel to the Y direction. The frame is provided on the pedestal 11 and is not shown in FIG. 2. A driving mechanism (not shown in FIG. 2) is provided in the frame and moves the spindle 46 in the above directions.

In the above structured cutting unit 45, the rotation axis of the cutting blade 47 extends in the Y direction and is perpendicular to a moving direction of the chuck table 42 which moves in the X direction. Thus, when the table base 41 is moved and the rotation center of the chuck table 42 reaches an extended line of the rotation axis of the cutting blade 47, the rotation axes of the cutting blade 47 and the chuck table 42 perpendicularly cross each other. The position of the wafer 1 in the above condition is referred to as "cutting position". When the wafer 1 is positioned at the cutting position, the reciprocation range of the spindle 46 in the Y direction is a range which corresponds to a diameter of the predetermined cut line 5 and which the cutting blade 47 covers, that is, a range in which the cutting blade 47 crosses two points which are positioned on the predetermined cut line 5 in the Y direction so as to be apart from each other.

A blade cover 48 is provided on an end portion of the spindle 46 proximate to the cutting blade 47 (on a side of the Ya direction). Cutting water nozzles 49A and 49B are provided on the blade cover 48 and supplies cutting water to the wafer 1 for lubricating, cooling, cleaning, and the like in the cutting.

In the above structured cutting mechanism 40, the wafer 1 is chucked and held on the chuck table 42, and the wafer 1 is cut by the cutting blade 47 which is rotated with respect to the wafer 1 at a high speed. A cutting position of the cutting blade 47 into the wafer 1 in the Y direction is adjusted by moving the spindle 46 in the Y direction. A cut depth by the cutting blade 47 into the wafer 1 is adjusted by moving the spindle 46 in the Z direction. When the wafer is subjected to circular cutting in this embodiment, the cutting blade 47 cut a layer of the wafer 1, which has a predetermined depth, and the chuck table 42 is rotated while the above condition of the cutting blade 47 is maintained.

D. Cleaning Unit

The cleaning unit 50 is equipped with a chuck table 51, a cleaning water nozzle (not shown in FIG. 2) and an air nozzle (not shown in FIG. 2). The chuck table 51 is the same type as the chuck table 42 of the cutting mechanism 40. The cleaning water nozzle and the air nozzle are provided around the chuck table 51. The chuck table 51 chucks and holds the wafer 1 on a flat upper surface thereof, and is rotated at a high speed by a rotation driving mechanism (not shown in FIG. 2). Cleaning water is sprayed from the cleaning water nozzle onto the wafer 1 which is held and rotated on the chuck table 51 at a high speed, so that the wafer 1 is cleaned. Then, the rotation of the chuck table 51 is continued and the spraying of the cleaning water is stopped. As a result, the cleaning water is spun out, and the air is blown onto the wafer 1 from the air nozzle, so that the cleaned wafer 1 is dried.

3. Action of Cleaning Apparatus

Next, actions of the above cutting apparatus 10 will be explained hereinafter. As described above, the embodiment uses the cutting method for preventing formation of a knife edge shape at the circumferential edge of the wafer 1 after the thinning by using the cutting apparatus 10. In this cutting method, as shown in FIGS. 4A to 4C, 5A to 5C, and 6A to 6C, a circular groove 4 is formed on the circumferential edge on the surface of the wafer 1 along the predetermined cut line 5. In this case, the cutting blade 47 has an edge thickness of 0.1 mm for formation of groove.

In the cutting by the cutting apparatus 10, first, one wafer 1 provided in the cassette 30 is horizontally disposed between the two guide bars 21 of the positioning mechanism 20 by the above moving robot. In this case, the surface of the wafer 1 faces upward. Next, the two guide bars 21 move toward each other in cooperation. When the two guide bars 21 contact the wafer 1 and the wafer 1 is sandwiched therebetween, the movements of the two guide bars 21 are stopped. Thus, the wafer 1 is positioned at a moving start position for moving the wafer 1 to the chuck table 42 of the cutting mechanism 40.

Figure 4A:
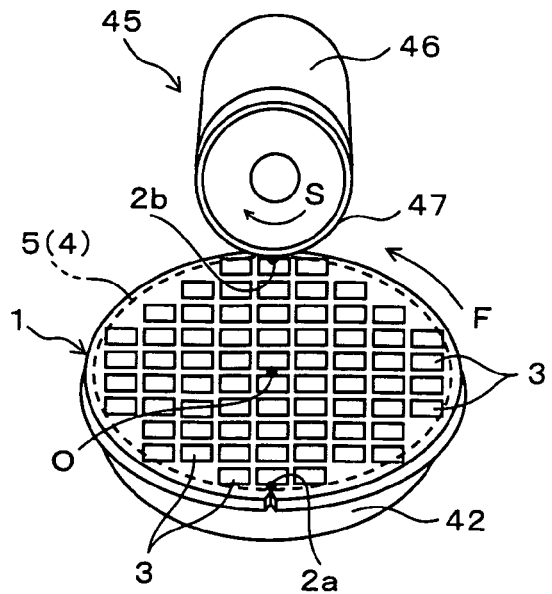
FIGS. 4A to 4C show a condition in which the cutting blade cuts the wafer at a cut point on one side of the wafer (on a side of the Yb direction) and a groove is formed.
Figure 4B:
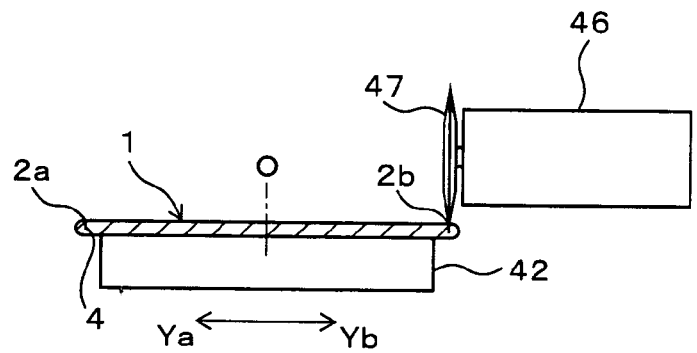

The chuck table 42 is driven to chuck beforehand. The wafer 1 is moved to the chuck table 42 by the moving robot, and is chucked and held by the chuck table 42. In this case, the above predetermined cut line 5 is set. The predetermined cut line 5 has a circular shape which has a diameter concentric with the rotation center of the chuck table 42 and which surrounds plural regions for forming the semiconductor chips 3. Two cut points 2a and 2b are set at points on the predetermined cut line 5, which are the most proximate to the side of the Ya direction and the side of the Yb direction as shown in FIGS. 4A and 4B. The cut points 2a and 2b correspond to points which are away from a rotation center O of the wafer 1, which is rotated by the rotation of the chuck table 42, in the Ya and Yb directions by a radius of the wafer 1 which is finally intended to be obtained. That is, the cut points 2a and 2b are symmetrical with respect to the rotation center O of the wafer 1 in the Y direction.

Next, the table base 41 is appropriately moved in the X direction, so that the wafer 1 is stopped at a cut position. The spindle 46 is appropriately moved in the Y direction, so that the cutting blade 47 is positioned directly above the cut point 2b on the side of the Yb direction. When the cutting blade 47 is set at the cutting start point in the above manner, the cutting blade 47 is rotated at a high speed. Then, as shown in FIGS. 4A and 4B, the cutting blade 47 is moved downward and cuts into a layer of the wafer 1 at the cut point 2*b* of the wafer 1. The layer has a predetermined thickness. The cut depth by the cutting blade 47 corresponds to a desired thickness of the wafer 1 after thinning.

Next, while the cut depth by the cutting blade 47 rotated at a high speed is maintained constant, the wafer 1 is rotated by the rotation of the chuck table 42 in one direction at a predetermined speed (for example, 1 to 10 mm/sec), the cutting blade 47 cuts the wafer 1 along the predetermined cut line 5. When one rotation of the wafer 1 is performed and the cutting blade 47 returns the cut point 2*b*, the circular groove 4 is formed along the predetermined cut line 5. After the circular groove 4 is formed, the cutting blade 47 is moved upward to a waiting position.

In the above manner, the formation of the groove 4 on one wafer 1 is performed. Next, in the same manner, grooves 4 are continuously formed by the cutting mechanism 40 on the wafers 1 which are provided in the cassette 30. In this case, the cutting blade 47 alternately cuts into the cut points 2*a* and 2*b* on the sides of the Ya and Yb directions.

Figure 5A:
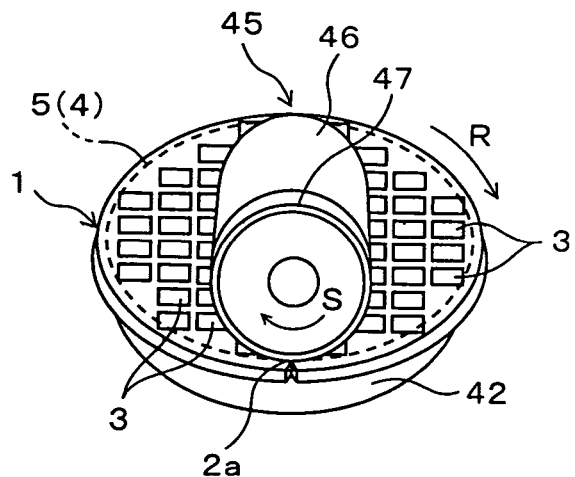
FIGS. 5A to 5C show a condition in which the cutting blade cuts the wafer at a cut point on the other side of the wafer (on a side of the Ya direction) and a groove is formed.
Figure 5B:
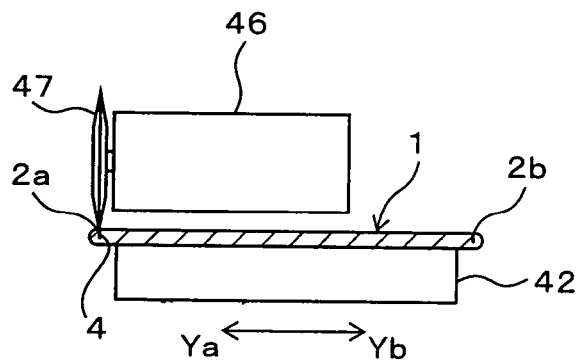

When the cutting blade 47 cuts into the cut point 2*a* on the side of the Ya direction, the spindle 46 is moved in the Ya direction and the cutting blade 47 crosses the wafer 1, and the cutting blade 47 is positioned directly over the cut point 2*a*. Then, as shown in FIGS. 5A and 5B, the cutting blade 47 is moved downward to the cut point 2*a* and cuts the wafer 1 thereat. Next, while the cut depth by the cutting blade 47 is constant, one rotation of the chuck table 42 is performed, so that the groove 4 is formed. In order that the cutting blade 47 cut into the cut point 2*b* again from the above condition, the spindle 46 is moved in the Yb direction, the cutting blade 47 is positioned directly over the cut point 2*b* and is moved downward thereto.

In the above manner, the spindle 46 is reciprocated within an interval, which is defined by the cut points 2*a* and 2*b*, in the Y direction, so that the cutting blade 47 alternately cuts into the cut points 2*a* and 2*b*. In this alternate cutting, the cut point may be changed in processing for every wafer 1. Alternatively, after plural wafers 1 are cut into the cut point 2*a* (or 2*b*), wafers 1, of which the number is the same as that of the wafers cut into the cut point 2*a* (or 2*b*), are cut into the cut point 2*b* (or 2*a*). The point in this alternate cutting is that the cut frequencies by the cutting blade 47 are the same at the cut points 2*a* and 2*b* when a large number of wafers 1 are processed.

When the cut points 2*a* and 2*b* at which the wafers 1 are cut are alternately changed, the rotation direction of the chuck table 42 is changed for the cut points 2*a* and 2*b*, so that down cutting is performed by the cutting blade 47 with respect to all the wafers 1 which are rotated. As shown in FIG. 4A, in a case in which the rotation direction of the chuck table 42 is an arrow direction S (that is, a clockwise direction when seen from the side of the Ya direction), when the cutting blade 47 cuts into the cut point 2*b*, the rotation direction of the chuck table 42 is an arrow direction F (that is, a counterclockwise direction when seen from the upside). When the cutting blade 47 cuts into the cut point 2*a*, as shown in FIG. 5A, the rotation direction of the chuck table 42 is an arrow direction R (that is, a clockwise direction when seen from the upside).

Figure 7A:
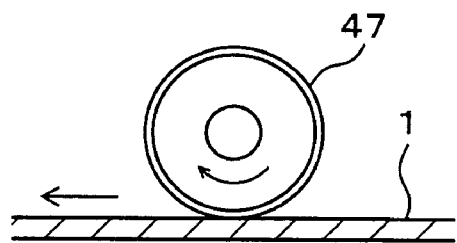
FIGS. 7A and 7B show a difference in a rotation direction of the cutting blade which cuts the rotated wafer.

The rotation direction of the chuck table 42 is changed in the above manner, as shown in FIG. 7A, down cutting is performed in which the rotation direction of the cutting blade 47 corresponds with the rotation direction of the rotated wafer 1 on the surfaces on which the cutting blade 47 and the wafer 1 face each other. When the wafer 1 is chucked and held by the chuck table 42, the wafer 1 is pressed on the chuck table 42 by the cutting blade 47, so that the held condition of the wafer 1 is secured in the down cutting of the embodiment. Therefore, the down cutting is desirable.

Figure 7B:
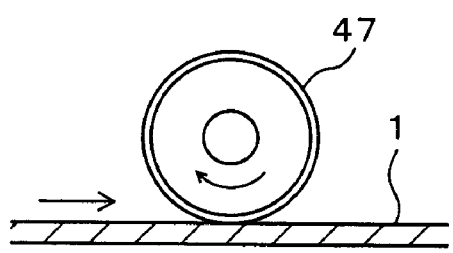

In a case in which the rotation direction of the chuck table 42 is maintained to be the arrow direction F shown in FIG. 4A, when the cutting blade 47 cuts into the cut point 2*a*, as shown in FIG. 7B, up cutting is performed in which the rotation direction of the cutting blade 47 is opposite to the rotation direction of the rotated wafer 1 on the surfaces on which the cutting blade 47 and the wafer 1 face each other. In the up cutting, the cutting blade 47 draw up the wafer 1 and the wafer 1 is thereby vibrated, so that the sides of the groove 4 may have cracking. Therefore, the up cutting is not desirable.

In the above manner, the groove 4 is formed by the cutting mechanism 40. Next, the wafer having the groove 4 formed thereon is moved again to the positioning mechanism 20 by the moving robot. After a moving start point of the wafer 1 with respect to the chuck table 51 of the cleaning unit 50 is determined by the positioning mechanism 20, the wafer 1 is moved to the chuck table 51 of the cleaning unit 50 by the moving robot. The wafer 1 is chucked and held on the chuck table 51. Then, while the chuck table 51 is rotated at a high speed, cleaning water is sprayed from the cleaning water nozzle onto the rotated wafer 1 for a predetermined time period. Thus, the water which exists on the surface of the wafer 1 and the formed groove 4 is spin out, and cut waste and dust are removed from the wafer 1, so that the wafer 1 is cleaned.

Then, while the rotation of the chuck table 51 is continued, the air is blown from the air nozzle onto the wafer 1, so that the wafer 1 is dried. The wafer 1 cleaned in the above manner is moved from the cleaning unit 50 to the cassette 30 via the positioning mechanism 20 by the moving robot. The wafer 1 in the cassette 30 is transferred to a thinning process by grinding a rear surface of the wafer 1.

Figure 8:
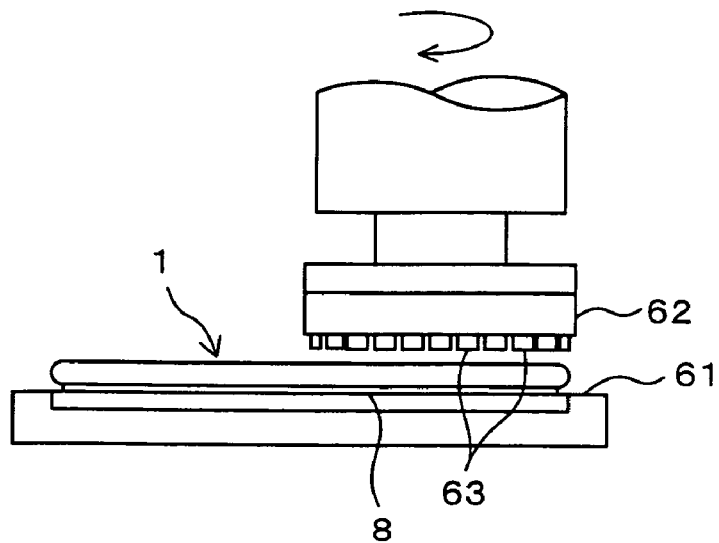
FIG. 8 is a side view showing a thinning process for grinding the rear surface of the wafer.

In the thinning process, as shown in FIG. 8, the wafer 1 having a protective tape 8 applied on the rear surface thereof is chucked and held on a vacuum chuck type chuck table 61 via the protective tape 8. The surface of the wafer 1 is pressed by a grinding stone 63 of grinding wheel 62 which is rotated at a high speed. Thus, the rear surface of the wafer 1 is ground.

Figure 6A:
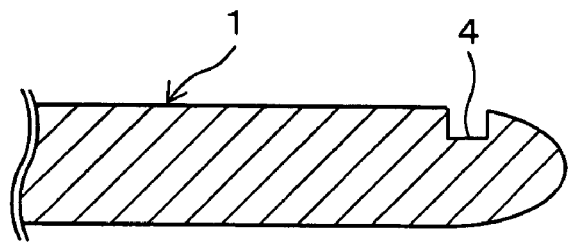
FIG. 6A is a cross sectional view showing a process for forming the groove on a circumferential edge of the wafer.
Figure 6B:
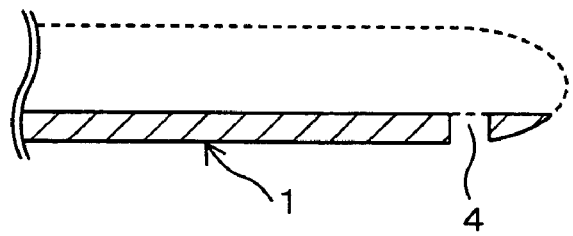
FIG. 6B is a cross sectional view showing a thinning process for grinding a rear surface of the wafer.
Figure 6C:
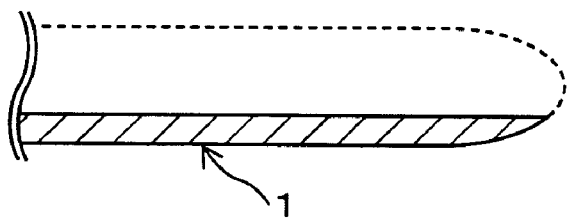
FIG. 6C is a cross sectional view showing a thinned wafer which was not subjected to the process for forming the groove thereon.

After the rear surface of the wafer 1 is ground and the wafer 1 has a desired thickness, as shown in FIG. 6B, the circumferential edge of the wafer 1, which is disposed outwardly from the groove 4, is separated and removed from the wafer 1. A new circumferential edge is formed on an internal surface of the groove 4 which extends in a thickness direction of the wafer 1. This is because the depth of the groove 4 corresponds to the desired thickness of the wafer 1. Therefore, the depth of the groove 4 should correspond to the desired thickness of the wafer 1 after the thinning, and may be deeper than the desired thickness of the wafer 1. If the wafer 1 is subjected to thinning without the groove 4 formed in the same manner as the conventional technique, as shown in FIG. 6C, the circumferential edge is sharper so as to have a knife edge shape, and damage (for example, cracking and breakage) easily occurs. The dotted line shown in FIGS. 6A to 6C denotes a ground portion of the wafer 1.

As explained above, in the embodiment, cut points by the cutting blade 47 into the wafer 1 are set at two points (cut points 2*a* and 2*b*) which are positioned on both sides of the rotation center O and the cutting blade 47 alternately cuts into the cut points 2*a* and 2*b* with the same frequency. The partial wear, in which the wear amount of one surface of the cutting blade 47 is larger than that of the other surface of the cutting blade 47, can be inhibited.

Figure 4C:
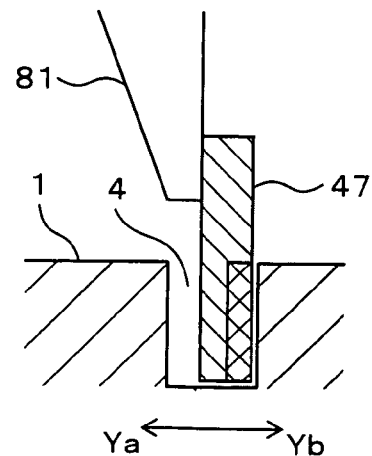
Figure 5C:
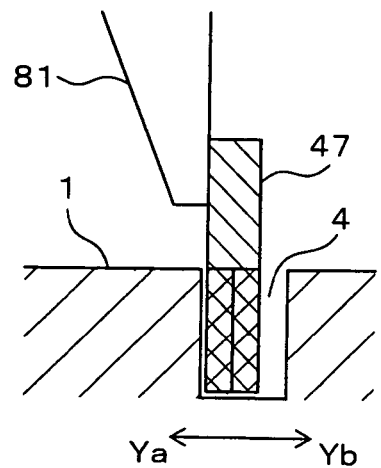

The detail of the inhibition of the partial wear will be explained hereinafter. When the wafer 1 is rotated and the circular groove 4 is formed by the cutting blade 47, the wear amount of the surface of the cutting blade 47 which faces the outer circumferential side of the wafer 1 is large. That is, when the cutting blade 47 cuts into the cut point 2b on the side of the Yb direction and formation of groove is performed by the cutting blade 47, as shown in FIG. 4C, the surface of the cutting blade 47 on the side of the Yb direction strongly contacts the internal wall of the groove 4, so that the surface of the cutting blade 47 on the side of the Yb direction wears more greatly than that on the side of the Ya direction. On the other hand, when the cutting blade 47 cuts into the cut point 2a on the side of the Ya direction and formation of groove is performed by the cutting blade 47, as shown in FIG. 5C, the surface of the cutting blade 47 on the side of the Ya direction strongly contacts the internal wall of the groove 4, so that the surface of the cutting blade 47 on the side of the Ya direction wears more greatly than that on the side of the Yb direction. In FIGS. 4C and 5C, cross diagonal lines denote potions in which wear amount is large.

In the above manner, in the cutting blade 47, the surface on the side of the Yb direction wears more greatly than that on the side of the Ya direction when the cutting blade 47 cuts into the cut point 2b. On the other hand, in the cutting blade 47, the surface on the side of the Ya direction wears more greatly than that on the side of the Yb direction when the cutting blade 47 cuts into the cut point 2a. Therefore, the cutting blade 47 alternately cuts into the cut points 2a and 2b with the same frequency, both surfaces of the cutting blade 47 wear equally and the partial wear can be inhibited on the entire surfaces of the cutting blade 47.

4. Cutting for Forming Step Instead of Groove

Figure 9A:
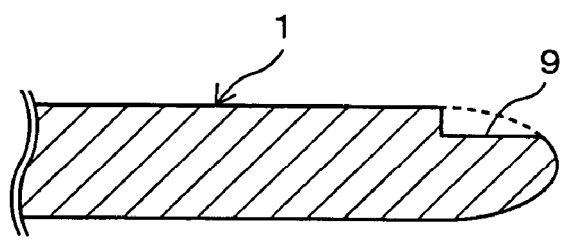
FIG. 9A is a cross sectional view showing a process for forming a step on the circumferential edge of the wafer.

In the above embodiment, the groove 4 is formed by the cutting on the circumferential edge of the wafer 1 in order to prevent formation of a knife edge thereat. Instead of the groove 4, a step 9 shown in FIG. 9A is formed so that the same effects as in the above embodiment can be obtained. In order to form the step 9, the cutting blade 47 of the cutting unit 45 has an edge thickness (for example, about 0.5 mm) which is thicker than that in the above embodiment. Next, the surface of the cutting blade 47 on the side of the Ya direction is positioned on the predetermined cut line 5, and the cutting blade 47 alternately cuts into the cut points 2a and 2b at an appropriate ratio in the same manner as the above embodiment. In this case, the edge thickness of the cutting blade 47 is set such that the edge of the cutting blade 47 projects outwardly from the circumferential edge. An unnecessary circumferential edge is cut and removed by forming the step 9. Next, the rear surface of the wafer 1 is thinned by grinding, so that the wafer 1 has no knife edge as shown in FIG. 9B.

Figure 9B:
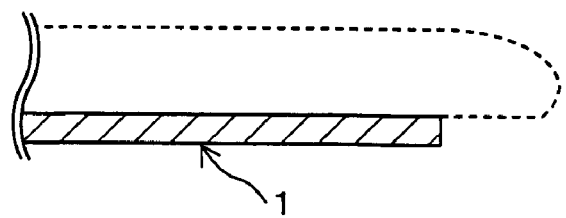
FIG. 9B is a cross sectional view showing a thinning process for grinding the rear surface of the wafer.

When the circular step 9 is formed as shown in FIGS. 9A and 9B, the surface of the cutting blade 47 which strongly contacts the internal circumferential side of the wafer 1 wears and the opposite surface of the cutting blade 47 which strongly contacts the outer circumferential side of the wafer 1 does not almost wear. Therefore, in the cutting blade 47, the surface on the side of the Yb direction wears more greatly than that on the side of the Ya direction when the cutting blade 47 cuts into the cut point 2a. On the other hand, the surface on the side of the Ya direction wears more greatly than that on the side of the Yb direction when the cutting blade 47 cuts into the cut point 2b.

5. Cutting for Removing Circumferential Edge

Figure 10A:
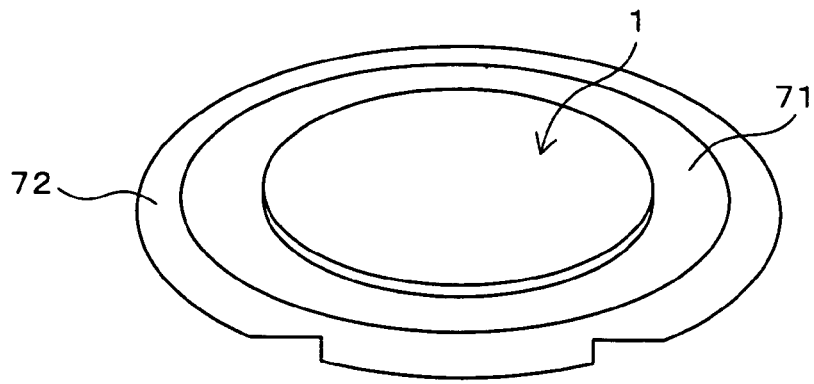
FIGS. 10A and 10B are a perspective view and a cross sectional view which show a semiconductor wafer supported by a dicing frame via a dicing tape.
Figure 10B:
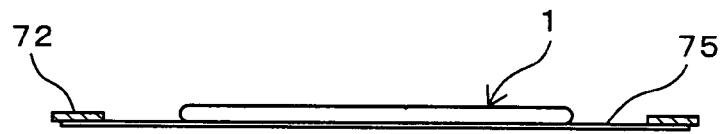

In the above embodiments, the groove 4 or the step 9 is formed by the cutting at the circumferential edge on the surface of the wafer 1 in order to prevent formation of a knife edge thereat when the wafer is thinned. Alternatively, the cutting for removing the entire circumferential edge and machining the wafer 1 to have a desired diameter before thinning of the wafer 1 can be performed by the lateral entry of the wafer 1 in the same manner as the above embodiments. In this case, it is inappropriate for the wafer 1 to be directly mounted on the chuck table 42 of the cutting mechanism 40 since the cutting blade 47 would penetrate the wafer 1 by the cutting and would contact the upper surface of the chuck table 42. Therefore, as shown in FIG. 10, a dicing tape 71 is applied to the rear surface of the wafer 1 and the cut depth by the cutting blade 47 is set such that the cutting blade 47 cuts a layer of the dicing tape 71.

The dicing tape 71 is an adhesive tape which has a circular shape larger than that of the wafer 1 and has an adhesive surface. The dicing tape 71 has a base film and an adhesive coated on a surface of the base film. For example, the base film of the dicing tape 71 is composed of polyvinylchloride and has a thickness of about 100 μm. The adhesive is composed of acrylic resin and has a thickness of about 5 μm. Since it is difficult to handle the wafer 1 when the dicing tape 71 is used in the above condition, a dicing frame 72 which is composed of a ring-shaped plate of metal (for example, stainless steel) is applied to a circumferential edge of the adhesive surface of the dicing tape 71, so that the wafer 1 can be handled by holding the dicing frame 72.

Figure 11:
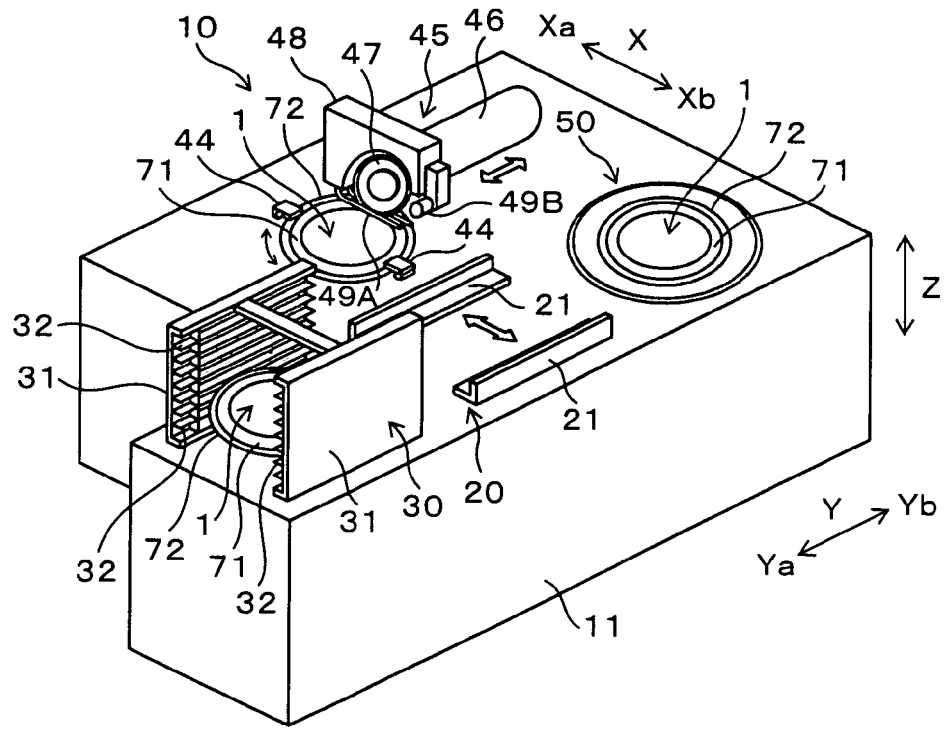
FIG. 11 is a perspective view showing a practical condition in which a circumferential edge of the wafer having the dicing tape and the dicing frame provided thereon is cut off by using the cutting apparatus showing in FIG. 2.
Figure 12A:
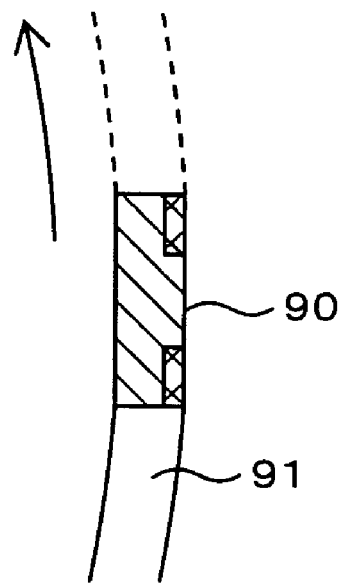
FIGS. 12A and 12B are a plan view and a front cross sectional view which show partial wear of cutting blade occurs by performing circular cutting on a wafer.
Figure 12B:
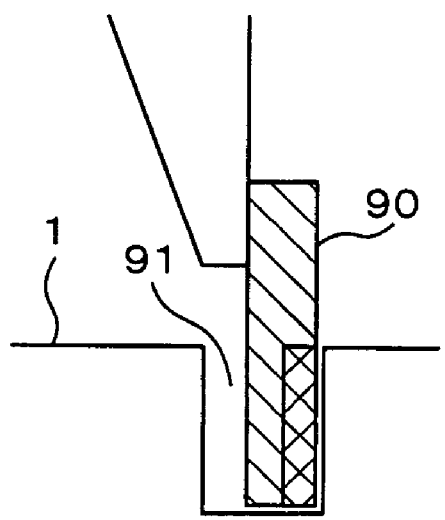

FIG. 11 shows a practical condition in which the wafer 1 having the dicing tape 71 and the dicing frame 72 provided thereon is subjected to cutting for removing the circumferential edge thereof. The dicing tape 71 and the dicing frame 72 holding the wafer 1 are provided in the above cassette 30. In the above same manner as the above embodiments, the wafer 1 is moved together with the dicing tape 71 and the dicing frame 72 from the cassette 30, and is subjected to the cutting for removing the circumferential edge thereof. In this cutting, in the same manner as the above embodiment, the cutting blade 47 alternately cuts into the cut points 2a and 2b.

In this cutting for removing the circumferential edge, the edge thickness of the cutting blade 47 is about 0.3 mm. In this case, a clamp 44 is provided to the table base 41 so as to control a vertical movement of the dicing frame 72. When the circumferential edge of the wafer 1 is cut and removed, in the same manner as the above embodiment, the outer circumferential edge of the cutting blade 47 wears more greatly. In addition, when the cut depth by the cutting blade 47 is appropriately changed in the cutting for removing the circumferential edge, wear amount of the cutting blade 47 in a radius direction is balanced, so that lifetime of the cutting blade 47 becomes much longer.

What is claimed is:

1. A cutting method for substrates, comprising:
preparing a plurality of substrates, each of the plurality of substrates which has a predetermined circular cut line set thereon;
chucking the substrate on a surface of a chuck table which is rotatably supported around a rotation axis of the chuck table such that the predetermined circular cut line of the substrate is concentric with the chuck table;
disposing a disc-shaped cutting blade having a rotation axis so that the cutting blade faces the substrate; and cutting the substrate along the predetermined circular cut line of the substrate by the culling blade while rotating the substrate by rotating the chuck table, wherein each of the plurality of substrates has two cut points which are set on one side and the other side of the predetermined circular cut line such that a rotation center of the substrate is positioned between the one side and the other side of the predetermined circular cut line, the cutting blade is disposed so that the rotation axis of the cutting blade perpendicularly crosses the rotation axis of the chuck table, the cutting blade is reciprocatably supported along the rotation axis of the cutting blade, and the cutting blade alternately cuts into the two cut points of each of the plurality of substrates.

2. A cutting method for substrates according to claim 1, wherein a rotation direction of the cutting blade is changed between in a case in which the cutting blade cuts into the cut point of the one side and in a case in which the cutting blade cuts into the cut point of the other side, so that down cutting is performed at the cut points of the one side and the other sides such that a rotation direction of the cutting blade corresponds with a rotation direction of the substrate between facing portions of the cutting blade and the substrate which face each other.

* * * * *